(12) United States Patent
Scade et al.

(10) Patent No.: US 8,059,458 B2
(45) Date of Patent: Nov. 15, 2011

(54) 3T HIGH DENSITY NVDRAM CELL

(75) Inventors: Andreas Scade, Dresden (DE); Stefan Guenther, Dresden (DE)

(73) Assignee: Cypress Semiconductor Corporation, San Jose, CA (US)

( * ) Notice: Subject to any disclaimer, the term of this patent is extended or adjusted under 35 U.S.C. 154(b) by 279 days.

(21) Appl. No.: 12/006,227

(22) Filed: Dec. 31, 2007

(65) Prior Publication Data

US 2009/0168520 A1   Jul. 2, 2009

(51) Int. Cl.
*G11C 11/34* (2006.01)
(52) U.S. Cl. .......... 365/185.08; 365/185.25; 365/185.28
(58) Field of Classification Search .......... 365/185.08, 365/222, 149, 185.07, 185.25, 185.28
See application file for complete search history.

(56) References Cited

U.S. PATENT DOCUMENTS

| | | | |
|---|---|---|---|
| 2,791,760 A | 5/1957 | Ross | |
| 3,636,530 A | 1/1972 | Mark et al. | |
| 3,676,717 A | 7/1972 | Lockwood | |
| 3,811,076 A | 5/1974 | Smith | |
| 3,836,894 A | 9/1974 | Cricchi | |
| 3,846,768 A | 11/1974 | Krick | |
| 3,950,737 A | 4/1976 | Uchida et al. | |
| 4,044,343 A | 8/1977 | Uchida | |
| 4,090,259 A | 5/1978 | Wilcock et al. | |
| 4,103,344 A | 7/1978 | Fagan et al. | |
| 4,103,348 A | 7/1978 | Fagan | |
| 4,112,507 A | 9/1978 | White et al. | |
| 4,128,773 A | 12/1978 | Troutman et al. | |
| 4,132,904 A | 1/1979 | Harari | |
| 4,138,737 A | 2/1979 | McCann | |
| 4,143,286 A | 3/1979 | Koike et al. | |
| 4,175,291 A * | 11/1979 | Spence | 365/184 |
| 4,264,376 A | 4/1981 | Yatsuda et al. | |
| 4,270,188 A | 5/1981 | Saito | |
| 4,271,487 A | 6/1981 | Craycraft et al. | |
| 4,306,353 A | 12/1981 | Jacobs et al. | |
| 4,342,101 A | 7/1982 | Edwards et al. | |
| 4,354,255 A | 10/1982 | Stewart | |
| 4,370,798 A | 2/1983 | Lien et al. | |
| 4,375,086 A * | 2/1983 | van Velthoven | 365/149 |
| 4,403,306 A | 9/1983 | Tokushige et al. | |
| 4,449,205 A | 5/1984 | Hoffman | |
| 4,541,006 A | 9/1985 | Ariizumi et al. | |
| 4,541,073 A | 9/1985 | Brice et al. | |
| 4,560,419 A | 12/1985 | Bourassa et al. | |
| 4,597,062 A | 6/1986 | Asano et al. | |
| 4,609,999 A | 9/1986 | Rosini | |
| 4,611,309 A * | 9/1986 | Chuang et al. | 365/185.08 |
| 4,617,652 A | 10/1986 | Simko | |
| 4,675,715 A | 6/1987 | Lepselter et al. | |

(Continued)

FOREIGN PATENT DOCUMENTS

JP    61077196 A  *  4/1986

(Continued)

OTHER PUBLICATIONS

International Search Report of the International Searching Authority for International Application No. PCT/US/08/87795 dated Feb. 18, 2009; 2 pages.

(Continued)

*Primary Examiner* — Alexander Sofocleous (57) ABSTRACT

A memory circuit includes a single transistor storing both volatile and nonvolatile bit charges.

21 Claims, 9 Drawing Sheets

U.S. PATENT DOCUMENTS

| | | | |
|---|---|---|---|
| 4,679,170 A | 7/1987 | Bourassa et al. | |
| 4,694,428 A | 9/1987 | Matsumura et al. | |
| 4,698,787 A | 10/1987 | Mikher et al. | |
| 4,701,858 A | 10/1987 | Stokes et al. | |
| 4,725,983 A * | 2/1988 | Terada | 365/185.08 |
| 4,747,083 A | 5/1988 | Nakajima et al. | |
| 4,758,993 A | 7/1988 | Takemae | |
| 4,769,787 A | 9/1988 | Furusawa et al. | |
| 4,774,203 A | 9/1988 | Ikeda et al. | |
| 4,799,194 A | 1/1989 | Arakawa | |
| 4,800,533 A | 1/1989 | Arakawa | |
| 4,805,150 A | 2/1989 | Asano et al. | |
| 4,819,207 A | 4/1989 | Sakui et al. | |
| 4,823,318 A | 4/1989 | D'Arrigo et al. | |
| 4,858,185 A | 8/1989 | Kowshik et al. | |
| 4,858,194 A | 8/1989 | Terada et al. | |
| 4,870,615 A | 9/1989 | Maroyama et al. | |
| 4,924,438 A | 5/1990 | Kobatake | |
| 4,931,997 A | 6/1990 | Mitsuishi et al. | |
| 4,952,825 A | 8/1990 | Yoshida | |
| 4,962,481 A | 10/1990 | Choi et al. | |
| 4,962,484 A | 10/1990 | Takeshima et al. | |
| 5,018,108 A | 5/1991 | Maruyama | |
| 5,021,998 A | 6/1991 | Suzuki et al. | |
| 5,031,149 A | 7/1991 | Matsumoto et al. | |
| 5,043,946 A | 8/1991 | Yamauchi et al. | |
| 5,051,958 A | 9/1991 | Arakawa | |
| 5,060,195 A | 10/1991 | Gill et al. | |
| 5,065,362 A | 11/1991 | Herdt et al. | |
| 5,109,187 A | 4/1992 | Guliani | |
| 5,111,257 A | 5/1992 | Andoh et al. | |
| 5,140,551 A | 8/1992 | Chiu | |
| 5,140,552 A * | 8/1992 | Yamauchi et al. | 365/185.08 |
| 5,168,334 A | 12/1992 | Mitchell et al. | |
| 5,189,641 A | 2/1993 | Arakawa | |
| 5,214,606 A | 5/1993 | Hashimoto | |
| 5,241,507 A | 8/1993 | Fong | |
| 5,245,570 A | 9/1993 | Fazio et al. | |
| 5,247,480 A | 9/1993 | Itoh et al. | |
| 5,251,171 A * | 10/1993 | Yamauchi | 365/185.08 |
| 5,253,206 A | 10/1993 | Tanaka et al. | |
| 5,262,986 A | 11/1993 | Yamauchi | |
| 5,282,175 A | 1/1994 | Fujita et al. | |
| 5,283,764 A | 2/1994 | Kim et al. | |
| 5,287,319 A | 2/1994 | Fukumoto | |
| 5,353,248 A | 10/1994 | Gupta | |
| 5,357,465 A | 10/1994 | Challa | |
| 5,387,534 A | 2/1995 | Prall | |
| 5,424,569 A | 6/1995 | Prall | |
| 5,426,605 A | 6/1995 | Van Berkel et al. | |
| 5,436,480 A | 7/1995 | Yu | |
| 5,440,508 A | 8/1995 | Pathak et al. | |
| 5,467,300 A | 11/1995 | Komarek et al. | |
| 5,485,429 A | 1/1996 | Ono | |
| 5,488,579 A | 1/1996 | Sharma et al. | |
| 5,496,756 A | 3/1996 | Sharma et al. | |
| 5,506,816 A | 4/1996 | Hirose et al. | |
| 5,510,638 A | 4/1996 | Lancaster et al. | |
| 5,511,020 A * | 4/1996 | Hu et al. | 365/185.28 |
| 5,602,776 A | 2/1997 | Herdt et al. | |
| 5,617,357 A | 4/1997 | Haddad et al. | |
| 5,638,323 A | 6/1997 | Itano | |
| 5,644,533 A | 7/1997 | Lancaster et al. | |
| 5,656,837 A | 8/1997 | Lancaster et al. | |
| 5,760,644 A | 6/1998 | Lancaster et al. | |
| 5,768,208 A | 6/1998 | Bruwer et al. | |
| 5,774,400 A | 6/1998 | Lancaster et al. | |
| 5,789,776 A | 8/1998 | Lancaster et al. | |
| 5,864,499 A | 1/1999 | Roohparvar et al. | |
| 5,892,712 A | 4/1999 | Hirose et al. | |
| 5,914,895 A | 6/1999 | Jenne | |
| 6,026,018 A | 2/2000 | Herdt | |
| 6,122,191 A | 9/2000 | Hirose et al. | |
| 6,141,248 A | 10/2000 | Forbes et al. | |
| 6,172,907 B1 | 1/2001 | Jenne | |
| 6,285,586 B1 | 9/2001 | Lung et al. | |
| 6,363,011 B1 | 3/2002 | Hirose et al. | |
| 6,414,873 B1 | 7/2002 | Herdt | |
| 6,532,169 B1 | 3/2003 | Mann et al. | |
| 6,556,487 B1 * | 4/2003 | Ratnakumar et al. | 365/185.08 |
| 7,110,293 B2 | 9/2006 | Jung | |
| 7,164,608 B2 | 1/2007 | Lee | |
| 7,233,522 B2 | 6/2007 | Chen et al. | |
| 7,280,397 B2 | 10/2007 | Scheuerlein | |
| 7,295,475 B2 | 11/2007 | Akaogi et al. | |
| 7,333,363 B2 | 2/2008 | Nakai et al. | |
| 7,423,912 B2 | 9/2008 | Perlegos et al. | |
| 7,429,767 B2 | 9/2008 | Bhattacharyya | |
| 7,499,322 B2 | 3/2009 | Lee et al. | |
| 7,518,916 B2 * | 4/2009 | Ashokkumar et al. | 365/185.07 |
| 7,612,403 B2 | 11/2009 | Bhattacharyya | |
| 2003/0223288 A1 * | 12/2003 | Choi | 365/200 |
| 2009/0147578 A1 * | 6/2009 | Scade et al. | 365/185.08 |

FOREIGN PATENT DOCUMENTS

| | | | |
|---|---|---|---|
| JP | 61077196 A2 | 4/1986 | |
| JP | 61077197 A * | 4/1986 | |
| JP | 61077197 A2 | 4/1986 | |
| JP | 6136994 A1 | 7/1998 | |
| JP | 6095794 A1 | 10/1998 | |
| WO | WO 9530244 A1 | 9/1995 | |
| WO | WO 9715929 A1 | 1/1997 | |

OTHER PUBLICATIONS

The Written Opinion of the International Searching Authority for International Application No. PCT/US08/87795 dated Feb. 18, 2009; 5 pages.

USPTO Non-Final Rejection for U.S. Appl. No. 12/006,270 dated Aug. 24, 2009; 13 pages.

USPTO Notice of Allowance for U.S. Appl. No. 09/681,317 dated Mar. 13, 2002; 4 pages.

USPTO Non-Final Rejection for U.S. Appl. No. 09/681,317 dated Jul. 24, 2001; 9 pages.

Herdt et al., "Analysis, Measurement, and Simulation of Dynamic Write Inhibit in a nvSRAM Cell," 1992, IEEE; 6 pages.

USPTO Notice of Allowance for U.S. Appl. No. 09/871,172 dated Dec. 13, 2002; 4 pages.

USPTO Non-Final Rejection for U.S. Appl. No. 09/871,172 dated Jul. 22, 2002; 6 pages.

USPTO Notice of Allowance for U.S. Appl. No. 08/549,483 dated Aug. 8, 1996; 3 pages.

USPTO Non-Final Rejection for U.S. Appl. No. 08/549,483 dated May 29, 1996; 5 pages.

USPTO Notice of Allowance for U.S. Appl. No. 08/846,558 dated Jul. 20, 1998; 3 pages.

USPTO Requirement Restriction for U.S. Appl. No. 09/136,694 dated Aug. 17, 1999; 4 pages.

Frohman-Bentchkowsky, "The Methal-Nitrice-Oxide-Silicon (MNOS) Transistor—Characteristics and Applications," Proceedings of the IEEE, vol. 58, No. 8, Aug. 1970, pp. 1207-1219; 13 pages.

Donaldson et al, "SNOS 1K X 8 Static Nonvolatile RAM," IEEE Journal of Solid-State Circuits, vol. SC-17, No. 5, Oct. 1982, pp. 847-851; 5 pages.

Hirose et al., "Non-Volatile Latch for FPGA Devices," NVX Corporation, Jan. 10, 1995; 6 pages.

Hirose et al., "Non-Volatile Latch Description," NVX Corporation, Nov. 1, 1995; 23 pages.

Hirose et al., "Non-Volatile Latch for Semiconductor Devices," NVX Corporation, Sep. 8, 1994; 13 pages.

USPTO Notice of Allowance for U.S. Appl. No. 07/361,033 dated Apr. 30, 1991; 4 pages.

USPTO Final Rejection for U.S. Appl. No. 07/361,033 dated Jan. 18, 1991; 5 pages.

USPTO Non-Final Rejection for U.S. Appl. No. 07/361,033 dated Jun. 12, 1990; 11 pages.

International Search Report of International Searching Authority, dated Jan. 14, 2009 for International Application No. PCT/US08/85688; 2 pages.

International Written Opinion of International Searching Authority, dated Jan. 14, 2009 for International Application No. PCT/US/08185688; 4 pages.

Benini et al. Energy-Adware Design of Embedded Memories: A Survey of Technologies, Architectures, and optimization Techniques.: In: ACM Transactions on Embedded Computing Systems (TECS) [online], vol. 2, No. 1, Feb. 2003, pp. 5-32 [retrieved on Jan. 9, 2009]. Retrieved from the internet<URL:http://www.dii.unisi.it/-giorgi/didattica/lp_references/Benini03-ACMTECS-Energy_Aware%20Design%20of%20Embedded%20memories%20a%20survey%20of%20technologies.pdf>, entire document; 28 pages.

USPTO Notice of Allowance for U.S. Appl. No. 09/426,100 dated Jul. 19, 2000; 4 pages.

USPTO Non-Final Rejection for U.S. Appl. No. 09/426,100 dated Mar. 10, 2000; 7 pages.

USPTO Notice of Allowance for U.S. Appl. No. 09/136,694 dated Apr. 24, 2000; 4 pages.

USPTO Non-Final Rejection for U.S. Appl. No. 09/136,694 dated Nov. 12, 1999; 8 pages.

USPTO Notice of Allowance for U.S. Appl. No. 09/626,267 dated Aug. 7, 2001; 5 pages.

USPTO Non-Final Rejection for U.S. Appl. No. 09/626,267 dated Mar. 28, 2001; 5 pages.

USPTO Requirement for Restriction/Election for U.S. Appl. No. 09/626,267 dated Dec. 1, 2000; 4 pages.

USPTO Notice of Allowance for U.S. Appl. No. 09/137,914 dated Jun. 9, 1999; 4 pages.

"nvSRAM Basics," Simtek 1999 Data Book, Chapter 8; 8-1 through 8-5; 5 pages.

USPTO Non-Final Rejection for U.S. Appl. No. 08/926,611 dated Jul. 7, 1998; 3 pages.

USPTO Notice of Allowance for U.S. Appl. No. 08/926,611 dated Dec. 14, 1998; 3 pages.

USPTO Non-Final Rejection for U.S. Appl. No. 08/772,970 dated Jun. 11, 1997; 4 pages.

USPTO Notice of Allowance for U.S. Appl. No. 08/234,288 dated Oct. 2, 1995; 1 page.

USPTO Final Rejection for U.S. Appl. No. 08/234,288 dated May 31, 1995; 3 pages.

USPTO Non-Final Rejection for U.S. Appl. No. 08/234,288 dated Oct. 6, 1994; 2 pages.

USPTO Notice of Allowance for U.S. Appl. No. 08/715,569 dated Aug. 19, 1997; 1 page.

USPTO Notice of Allowance for U.S. Appl. No. 08/735,973 dated Nov. 21, 1997; 3 pages.

Svensson et al., "Trap-Assisted Charge Injection in MNOS Structures, " Oct. 1973, J. Appl. Phys., vol. 44, No. 10; 7 pages.

Lundstrom et al., "Properties of MNOS Structures," Jun. 1972, IEEE Transactions on Electron Devices, vol. Ed-19, No. 6, 11 pages.

Takahashi et al., "Estimation of insulation layer Conductrance in MNOS Structure, " Nov. 1993, IEEE Transactions on Electron Devices, vol. 40, No. 11; 5 pages.

USPTO Notice of Allowance for U.S. Appl. No. 11/644,819 dated Dec. 4, 2008; 7 pages.

USPTO Notice of Allowance for U.S. Appl. No. 12/006,270 dated Aug. 6, 2010; 6 pages.

USPTO Non-Final Rejection for U.S. Appl. No. 12/007,270 dated Apr. 13, 2010; 5 pages.

USPTO Notice of Allowance for U.S. Appl. No. 12/007,270 dated Dec. 18, 2009; 6 pages.

USPTO Notice of Allowance for U.S. Appl. No. 11/999,684 dated Oct. 16, 2009; 4 pages.

USPTO Non-Final Rejection for U.S. Appl. No. 11/999,684 dated Mar. 18, 2009; 9 pages.

USPTO Notice of Allowance for U.S. Appl. No. 08/772,970 dated Oct. 15, 1997; 2 pages.

USPTO Notice of Allowance for U.S. Appl. No. 09/892,164 dated Oct. 17, 2002; 4 pages.

USPTO Non-Final for U.S. Appl. No. 09/892,164 dated Jun. 27, 2002; 6 pages.

USPTO Notice of Allowance for U.S. Appl. No. 08/772,970 dated Oct. 15, 1997; 2 pages.

USPTO Non-Final Rejection for U.S. Appl. No. 09/137,914 date Ju.n 9, 1999; 4 pages.

A 5-V-Only 16Mb Flash Memory with Sector Erase Mode by Jinbo et al., IEEE Jour. Solid State Circuits, vol. 27, No. 11, Nov. 1992 pp. 1547-1554; 8 pages.

A 3.3 V Single-Power-Supply 64 Mb Flash with Dynamic Bit-Line Latch (DBL) Programming Scheme, Takeshima et al., IEEE International Solid-State Circuits Conference, Feb. 1994 pp. 148-149; 2 pages.

USPTO Notice of Allowance for U.S. Appl. No. 08/633,857 dated Feb. 18, 1997; 3 pages.

USPTO Notice of Allowance for U.S. Appl. No. 08/427,826 dated Oct. 21, 1996; 4 pages.

USPTO Notice of Allowance for U.S. Appl. No. 08/427,826 dated Oct. 16, 1996; 8 pages.

* cited by examiner

3T HIGH DENSITY NVDRAM CELL

TECHNICAL FIELD

The present disclosure relates to electronic memory cells.

BACKGROUND

High speed volatile and non-volatile storage of data is an important feature in computer systems. Present solutions use specialized volatile memory technologies, like DRAM and SRAM with non volatile back up memories, such as BBSRAM, EEPROM and FLASH. In case of power loss significant amounts of volatile data may have to be stored in the non-volatile memory. This is typically done via signaling interfaces between volatile and nonvolatile memory regions, the interfaces having limited parallelism, high current requirements, and possibly using multiple processor cycles to manage the data transfer. A faster and less power intensive solution is nvSRAM memories, where each volatile cell is paired with a non-volatile cell and data may pass from one region to another without first being placed on a bus or other signaling interface. One disadvantage of present nvSRAM circuits is their limited density and relatively large memory cell size, typically involving 12 high and low voltage transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" a do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Embodiments comprising SONOS transistors are described herein. It should be appreciated that other types of nonvolatile storage elements may be employed, such as silicon nitride oxide semiconductor (SNOS) transistors, floating gate transistors, ferroelectric transistors, and capacitors, to name a few.

Figure 1:
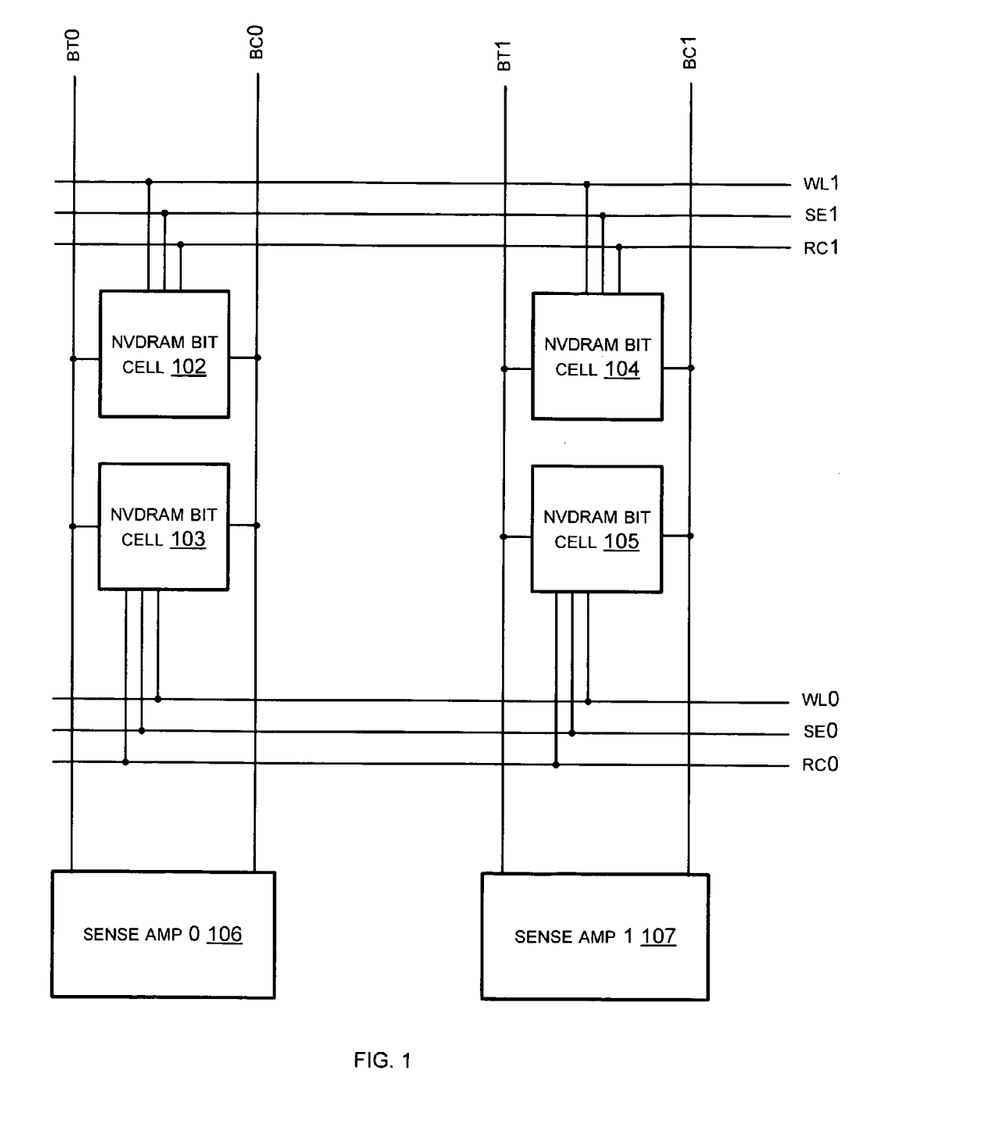
FIG. 1 is a block diagram of an embodiment of a memory system including combined volatile nonvolatile bit cells.

FIG. 1 is a block diagram of an embodiment of a memory system including combined volatile nonvolatile bit cells. The system, which may be arranged as an array of cells, comprises bit cells 102-105. The array comprises sense amplifiers 106 and 107. Data is presented to and retrieved from cells 102-105 using bit lines BT0 and BT1, and compliment bit lines BC0 and BC1. Signal paths SE0 and SE1 are used for ERASE and STORE operations on nonvolatile memory. Signal paths RC0 and RC1 are also used for operations on nonvolatile memory, RECALL in particular. The word lines WL0 and WL1 are activated for both volatile and nonvolatile operations, to couple internal structures of the cells 102-105 with the bit lines and their complement lines.

Each memory cell 102-105 acts to store a volatile and non-volatile memory bit. Additionally, each memory bit cell 102-105 acts to store a compliment to the volatile and non-volatile memory bits. During some operations, such as READ, WRITE, and STORE, the sense amplifiers 106 and 107 may react to differential voltages on the bit lines BTx and complement bit lines BCx to drive the bit line voltage levels to unambiguous logical zeros and ones. During other operations, such as RECALL, the sense amplifiers 106 and 107 may react to current flows on the bit lines BTx and complement bit lines BCx to drive the bit line voltage levels to unambiguous logical zeros and ones.

The array provides both volatile and non-volatile memory capability, with each cell 102-105 providing charge storage for both. Storing data into the volatile memory of cells 102-105 is performed using WRITE operations. Reading data from volatile memory of cells 102-105 is performed with READ operations. Storing data into the non-volatile memory of cells 102-105 is performed using STORE (FLASH WRITE) operations. FLASH WRITE operations may be preceded by a FLASH ERASE, which clears any stored nonvolatile bit. Reading data from the non-volatile memory of cells 102-105 is performed with RECALL (FLASH READ) operations.

In FIG. 1, two nvDRAM bit cells 102 and 103 have been associated with BT0 and BC0. Two nvDRAM bit cells 104 and 105 have been associated with BT1 and BC1. Word line WL0 has two cells 103 and 105 associated with it. Word line WL1 has two cells 102 and 104 associated with it. Of course, these are merely examples for the purpose of illustration, and in practice many more cells may be associated with particular word lines and bit lines.

Figure 2:
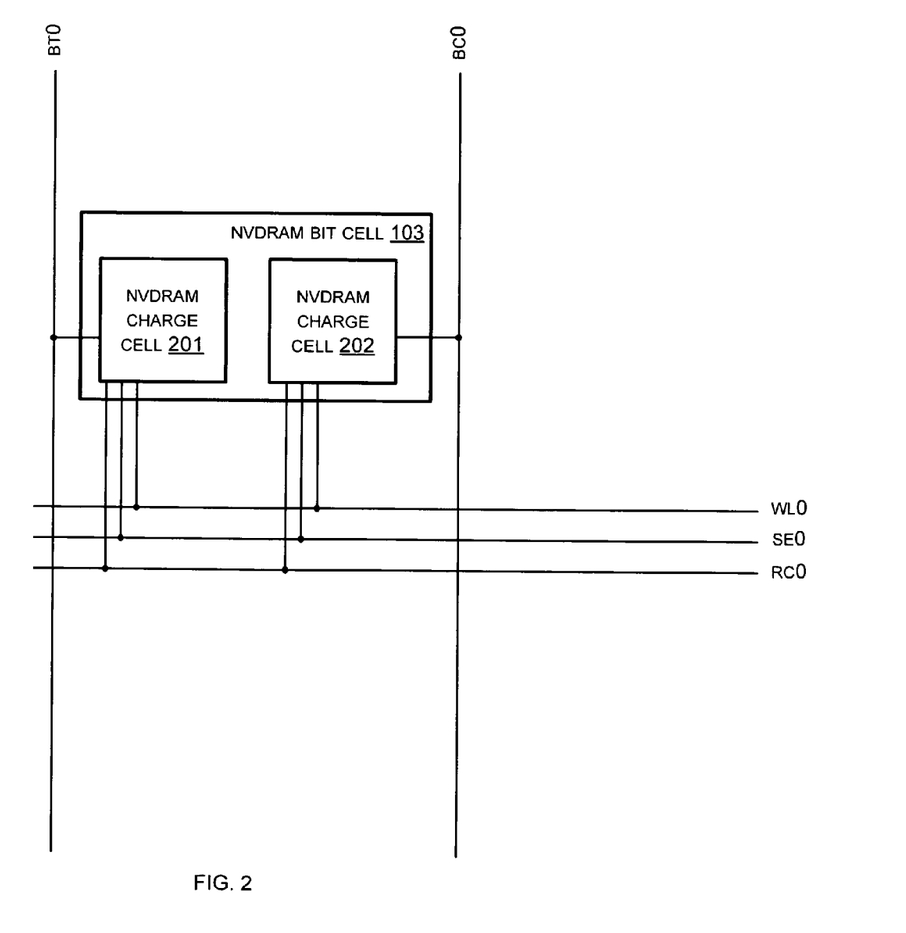
FIG. 2 is a block diagram of an embodiment of a combined volatile nonvolatile bit cell in more detail.

FIG. 2 is a block diagram of an embodiment of a combined volatile nonvolatile bit cell in more detail. The bit cell 103 comprises two charge cells 201 and 202. One charge cell 201 is coupled to bit line BT0. The second charge cell is coupled to compliment line BC0. When BT0 is used to write a one (e.g. high state) into charge cell 201, BC0 may simultaneously be used to write the logical compliment, a zero, into charge cell 202, and visa versa.

The word line WL0 and the signals SE0 and RC0 are each coupled to the two charge cells 201 and 202.

Figure 3:
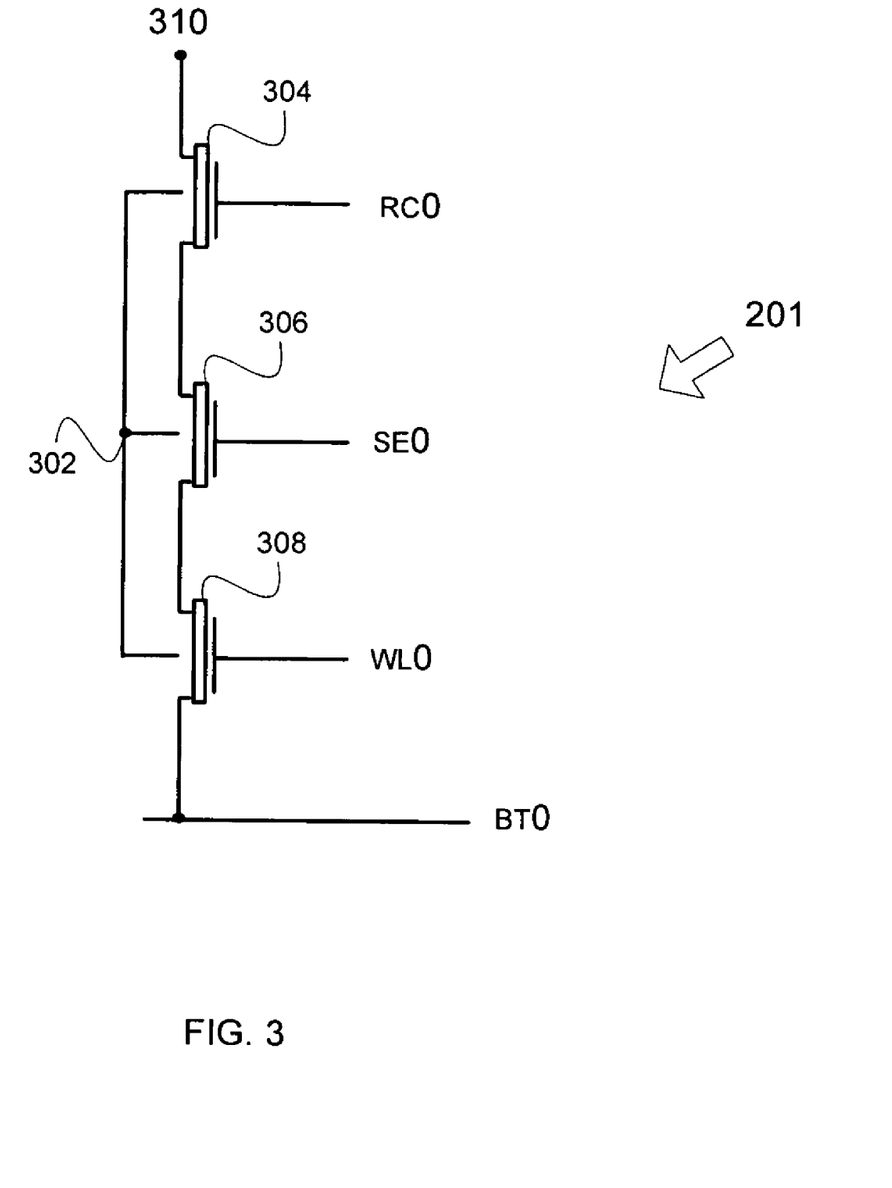
FIG. 3 is an illustration of an embodiment of a combined volatile nonvolatile charge cell.

FIG. 3 is an illustration of an embodiment of a combined volatile nonvolatile charge cell. The charge cell 201 comprises three transistors 304, 306, and 308. Transistors 304 and 308 act as isolation transistors, isolating the charge storage transistor 306 from the bit line BT0 and from voltages at 310. Transistor 306 stores charges representing both the non-volatile and volatile bits of the cell 201. The transistor 306 may be a SONOS (silicon oxide nitride oxide semiconductor) device. This arrangement may involve fewer transistors and thus less expense and higher densities than prior solutions.

Those skilled in the art will recognize that SONOS is only one possible transistor technology that may be employed to implement the features described herein. For example, in some embodiments other types of transistors such as dedicated floating gate devices may be employed.

The charge cell 201 comprises a node 302, also known as "bulk", which may be tied to a constant logical low, also known for example as Vss or ground.

Charge cell 201 comprises input 310 which is set low during DRAM operations. Signal 310 may be driven high for RECALL, to act as a source of current driven onto the bit line BT0. In some embodiments, 310 may go high during STORE as well, in order to reduce leakage current that may otherwise be generated by the higher voltages associated with certain nonvolatile operations (higher than for volatile operations).

The bit line BT0 is coupled to transistor 308. Transistor 308 acts to couple to the bit line BT0 to internal structures of the charge cell 201 during volatile and nonvolatile operation. Transistor 308 is turned on and off using the word line signal WL0.

Charge cell 201 comprises a signal line RC0 to the gate of isolation transistor 304. Signal RC0 may be asserted during RECALL to couple current source 310 to the internals of the cell 201.

Signal line SE0 is coupled to the gate of transistor 306. Signal SE0 may be asserted during nonvolatile STORE to drive charge into the ONO region of transistor 306. Transistor 306 stores the non-volatile charge as well as the volatile charge. Signal SE0 may also be asserted with a high negative voltage during ERASE to set the state of transistor 306 to a known state (e.g. a state similar to storing a logical nonvolatile "one").

Figure 4:
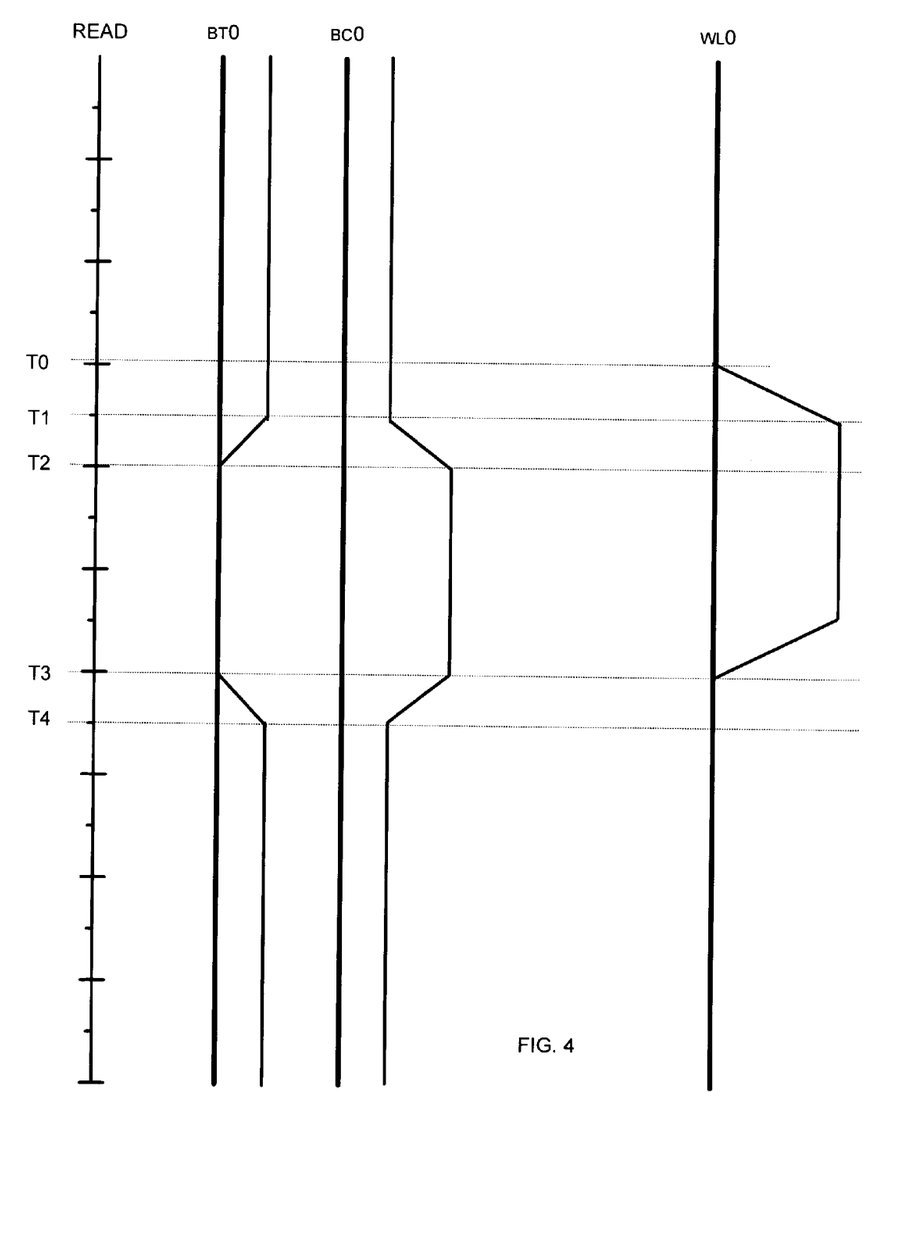
FIG. 4 is a time line diagram of an embodiment of a volatile READ operation.
Figure 5:
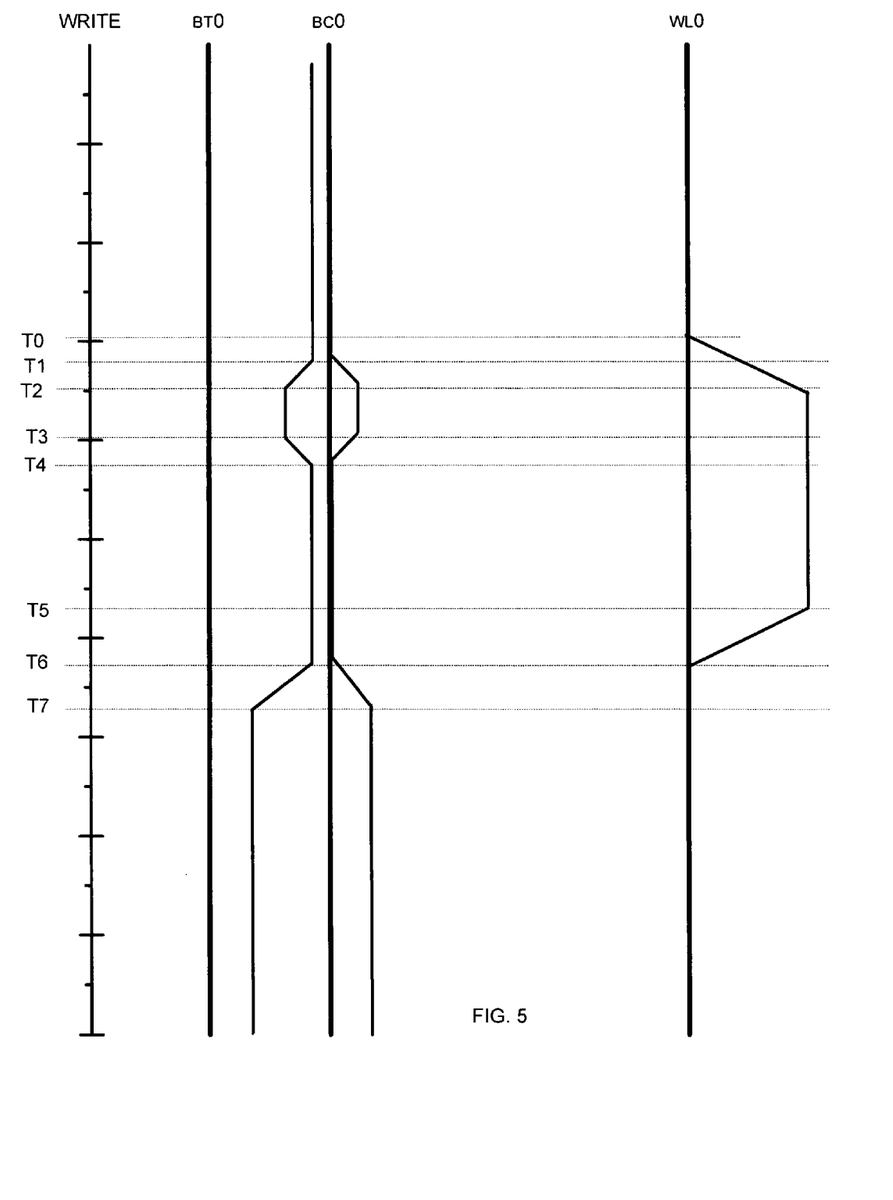
FIG. 5 is a time line diagram of an embodiment of a volatile WRITE operation.
Figure 6:
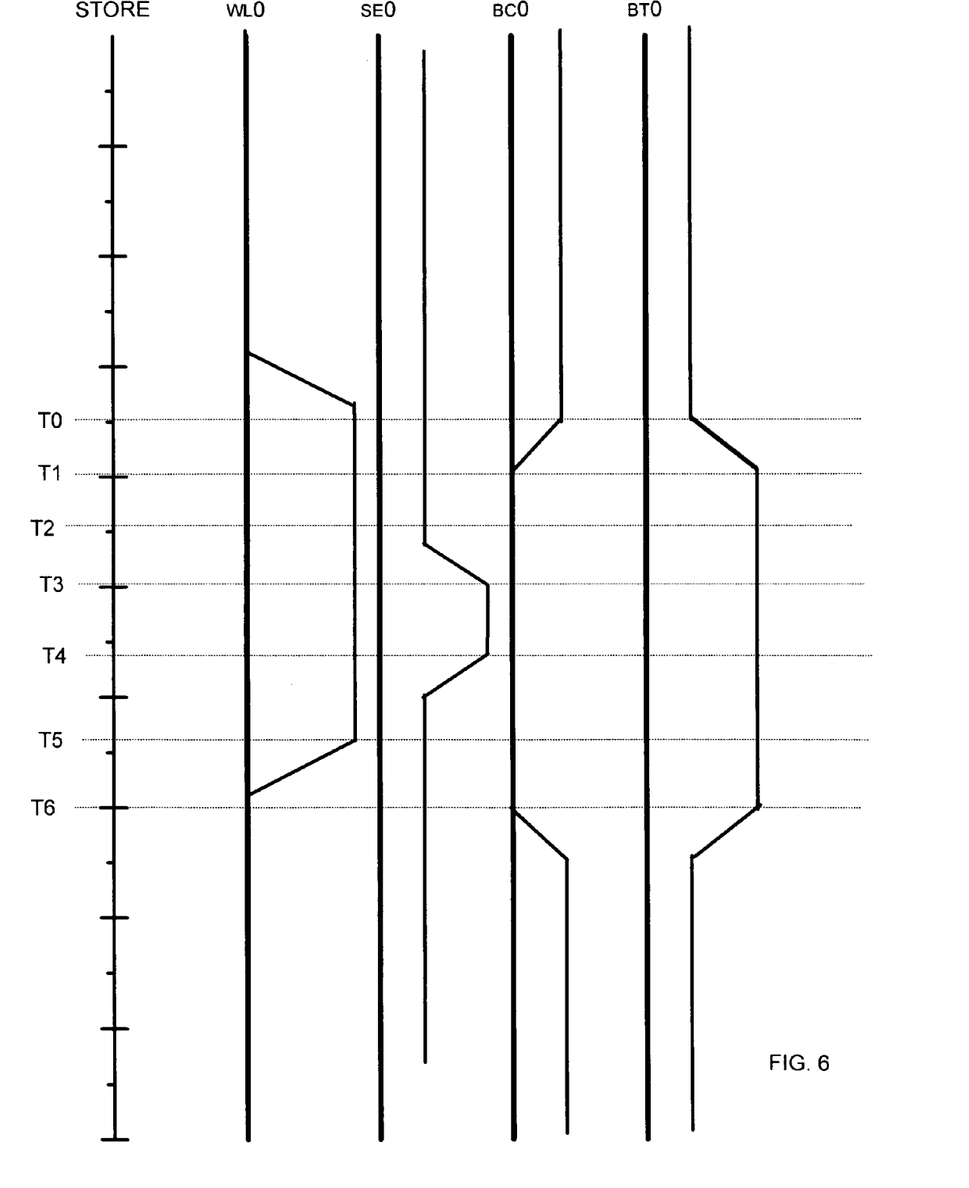
FIG. 6 is a time line diagram of an embodiment of a nonvolatile STORE operation.
Figure 7:
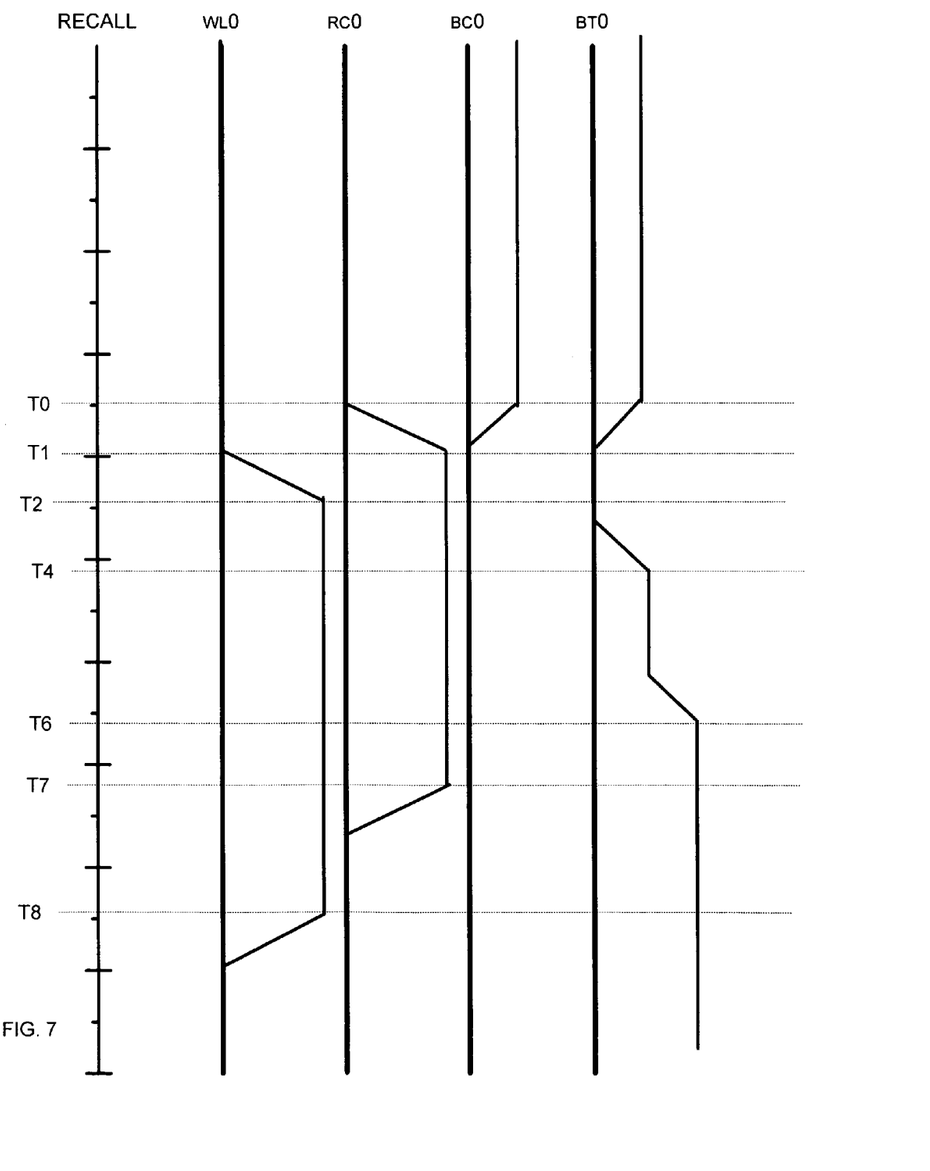
FIG. 7 is a time line diagram of an embodiment of a nonvolatile RECALL operation.
Figure 8:
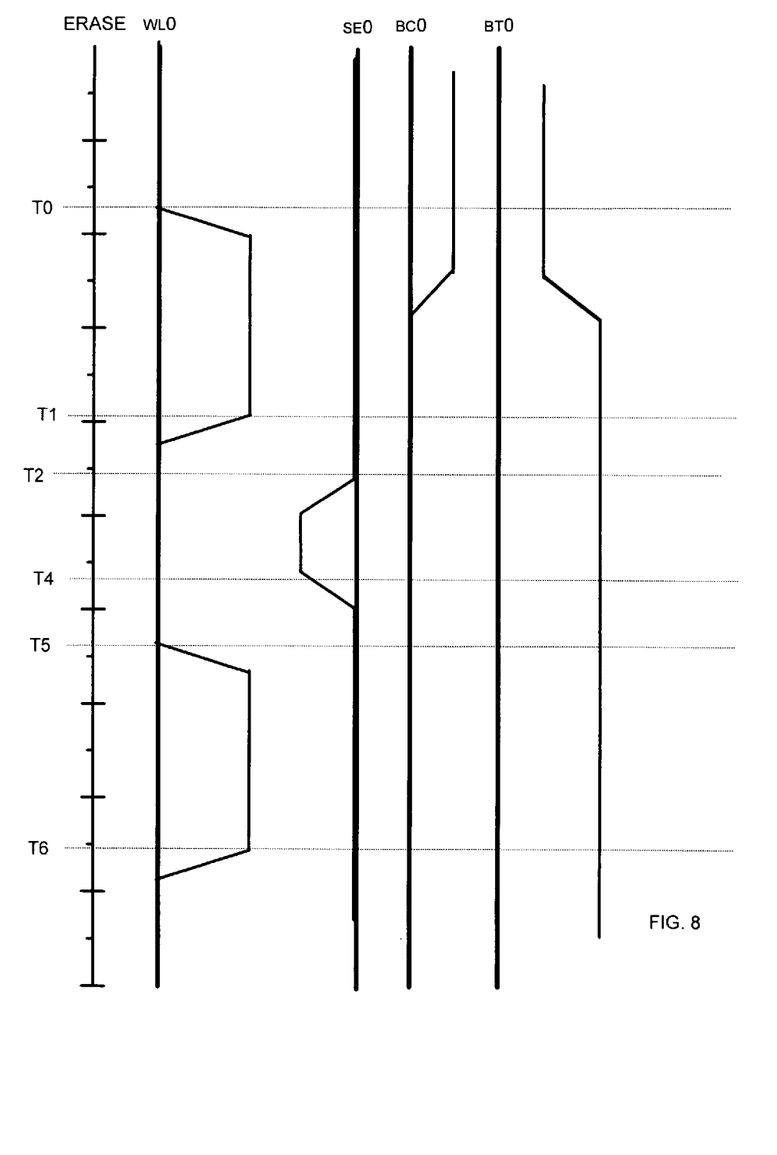
FIG. 8 is a time line diagram of an embodiment of a nonvolatile ERASE operation.

FIGS. 4-8 are time line illustrations showing embodiments of signaling for various volatile and nonvolatile operations. FIG. 4 is a time line diagram of an embodiment of a volatile READ operation. FIG. 5 is a time line diagram of an embodiment of a volatile WRITE operation. FIG. 6 is a time line diagram of an embodiment of a nonvolatile STORE operation. FIG. 7 is a time line diagram of an embodiment of a nonvolatile RECALL operation. FIG. 8 is a time line diagram of an embodiment of a nonvolatile ERASE operation.

Volatile READ

Referring to FIG. 4 in conjunction with FIG. 3, volatile READ operations involve signaling to transistors 306 and 308. RC0 and the voltage at node 310 may be zero (low) during READ. SE0 may be high. Initially, WL0 is low, and thus transistor 308 is off, isolating the cell 201 from the bit line BT0.

To begin the READ, the bit line BT0 may be pre-charged, in some embodiments to a level around halfway between high and low, or Vcc/2 (T0). The charge representing the volatile bit is stored by capacitance(s) formed by the source, bulk, drain, and gate of transistor 306 (henceforth, the "v-bit" charge storage). More specifically, v-bit charge storage is accomplished via gate to bulk 302 capacitances and source to drain capacitances of transistor 306. The v-bit charge is typically highly mobile. In some embodiments, transistor 306 is a SONOS transistor, and transistors 304 and 308 are conventional CMOS or other type transistors without an ONO (oxide nitride oxide) layer.

When the stored volatile bit is a one, the v-bit storage comprises a charge that is comparable to a one, or high. The v-bit of the complement charge cell will then be a zero, or low. When WL0 is asserted, no significant charge flows between BT0 and the v-bit storage. The complement v-bit is zero and BC0 is discharged. The sense amplifier engages and drives BT0 high and BC0 low.

When the stored volatile bit is a zero, the v-bit storage comprises no significant charge which is comparable to a zero, or low. This is the situation expressed in FIG. 4. When WLo is asserted, charge flows from BTo to the v-bit storage. This pulls down the voltage on BTo. BCo stays at approximately the pre-charge level. The sense amplifier engages and drives BTo to zero, or low ($T_1$-$T_2$), and BCo to one, or high.

After the volatile bit is sensed, the voltage on BTo will determine the setting of v-bit. If BTo is zero, v-bit remains uncharged and a zero volatile bit is stored when WLo is dropped ($T_2$-$T_3$). The opposite occurs on the BCo line. If BTo is one, v-bit is recharged and a "one" volatile bit is stored when WLo is dropped. In other words, v-bit and complement v-bit are "refreshed" during the READ operation.

After a READ, the bit lines may be reset to pre-charge levels (T4). During the READ, SE0 may be set to one or some comparable value to facilitate charge migration to and from v-bit.

Bit line voltage sensing during volatile READ operations may be based upon small differential voltages on the bit line and complement bit line. This may differ in some embodiments from bit line sensing during nonvolatile RECALL operations, which may be based more upon detecting current flows than on detecting small voltage differentials.

Volatile WRITE

Referring to FIG. 5 in conjunction with FIG. 3, volatile WRITE operations involve signaling to transistors 306 and 308. RC0 and the voltage at node 310 may be zero (low) during WRITE. SE0 may be high. Initially, WL0 is low, and thus transistor 308 is off, isolating the cell 201 from the bit line BT0.

When writing a one to the volatile bit, BT0 is set to one, or high. This is the situation expressed in FIG. 5. WL0 is set high (T0-T2). If there is no charge in v-bit storage (a previously stored volatile bit of zero), charge flows from BT0 to v-bit storage. The opposite will happen for complement v-bit. WL0 is brought low and a one is thus stored in v-bit storage as well as a zero being stored in complement v-bit. Transient effects may be seen on the bit line and complement bit line during the migration of charge (T1-T4).

WL0 may drop and the bit line and complement line may be reset to pre-charge levels (T5-T7). During the WRITE, SE0 may be set to one or some comparable value to facilitate charge migration to and from v-bit and complement v-bit.

When writing a zero to the volatile bit equal with one to complement v-bit, BTo is set to zero, or low and BCo to high. WLo is set high. If there is a charge in v-bit storage (a previously stored volatile bit of one), charge drains from v-bit storage to BTo. The opposite occurs with respect to BCo. WLo is brought low and a zero is thus stored in v-bit storage and a one is stored in complement v-bit.

Non-Volatile STORE

Referring to FIG. 6 in conjunction with FIG. 3, a STORE operation may be accomplished by first READing the v-bit and the complement v-bit charges to the bit lines BT0 (T0-T1) and BC0, respectively, then asserting SE0 to a "program" level Vprog (T3-T4). In some embodiments Vprog may be higher than the voltage representing a one bit. For example, when 306 is a SONOS transistor, Vprog may be approximately +10V.

Asserting Vprog causes the storage of the value of v-bit to nv-bit of transistor 306. If no charge is stored in v-bit, meaning the volatile bit is zero, the sense amplifier will hold BT0 and thus the source of transistor 306 low (e.g. 0V), and charge will flow to the SONOS gate traps. If charge is stored in v-bit, meaning the volatile bit is logical one, the source of transistor 306 is held high by the sense amplifier, and by capacitive coupling the source voltage of 306 to a high voltage state with no significant voltage difference between the channel and gate of transistor 306, consequently a nonvolatile 'one' bit, which is equal to an ERASE state, is stored. STORE of the complement v-bit to complement nv-bit works in substantially the same way. The situation expressed in FIG. 6 reflects STORE of a 'one' bit.

When WL0 is asserted, the sense amplifier will engage to pull the bit line BT0 to a one or zero, depending on whether v-bit stored a one or zero, respectively (T0-T1). See the discussion of volatile READ for more details.

After the nonvolatile bit and its complement are stored, the voltage on BTo will determine the setting of v-bit. If BTo is zero, v-bit remains uncharged and a zero volatile bit is stored when WLo is dropped. If BTo is one, v-bit is recharged and a one volatile bit is stored when WLo is dropped. In the same way determines BCo the setting of complement v-bit. In other words, v-bit and its complement are "refreshed" during the STORE operation.

A STORE will not overwrite an nv-bit of one with a v-bit of zero. Thus nv-bit (and complement nv-bit) may be cleared (erased) prior to performing a STORE, in order to ensure that during STORE nv-bit either remains a zero (if v-bit is a zero) or is flipped to a one if v-bit is one.

In some embodiments the node 310 may be set high (e.g. logical one) during STORE. The STORE still proceeds as described above, however leakage current across transistor 304 may be reduced.

Non-Volatile ERASE

Referring to FIG. 8 in conjunction with FIG. 3, an ERASE sets the stored value of nv-bit and complement nv-bit to known states (for example, nv-bit and complement nv-bit may be set to logical one). In some embodiments, to effect an ERASE, SE0 may be set to a relatively high negative value, such as (for 306 SONOS) −10V (T2-T4).

A READ of v-bit to BT0 (T0-T1) and complement v-bit to BC0 may precede the ERASE, and a WRITE from BT0 to v-bit and to complement v-bit from BC0 (T5-T6) may follow ERASE. This may act to prevent changes/destruction of v-bit during ERASE. In other words, v-bit is/can be "refreshed" during the ERASE operation. It also restores nv-bit and complement nv-bit to complement values.

Non-Volatile RECALL

Referring to FIG. 7 in conjunction with FIG. 3, a RECALL operation may be accomplished by first causing nv-bit/complement nv-bit to be represented on BT0/BC0 (nvREAD, T0-T6), then performing a WRITE to store the nv-bit value in v-bit and complement nv-bit value in complement v-bit.

To perform an nvREAD, RC0 and the voltage at node 310 are both set high (e.g. Vcc) (T0-T7). Setting RC0 high turns on transistor 304. WL0 is also set high (T1-T8), turning transistor 308 on. BT0 and SE0 may be set low (T0-T1). Setting SE0 will result in the channel of transistor 306 to switch "off", unless nv-bit is "one", in which case 306 will remain "on" or at least allow some current to pass through from source to drain.

If nv-bit stores a one, the transistor 306 will pass current between 310 and BT0. BT0 will be pulled toward a high value (T2-T4), and the sense amplifier will engage to drive BT0 fully to one (T4-T6). Otherwise, if nv-bit stores a zero, transistor 306 will not pass current between 310 and BT0. BT0 will remain low. In either case, the sensed value of BT0 will represent the stored value of nv-bit, and the sensed value of BC0 represents complement nv-bit.

Bit line voltage sensing during nonvolatile RECALL operations may be based upon sensing current flows, or may use current flows from 310 to the bit line BT0 to charge the bit line. This may differ in some embodiments from bit line sensing during volatile READ operations, which may be based more upon detecting small voltage differentials on the bit lines than on sensing current flows.

A WRITE may then be performed to store the value of BT0 to v-bit (see FIG. 5) and the value of BC0 to complement v-bit.

In some embodiments, the transistors 304 and 308 (which may be conventional CMOS) may be fabricated with different gate-oxide thicknesses from one another, to better suit the different voltage conditions applied to these transistors during nonvolatile operations. Thinner gate oxide layers in these transistors may improve the performance of RECALL operations.

Figure 9:
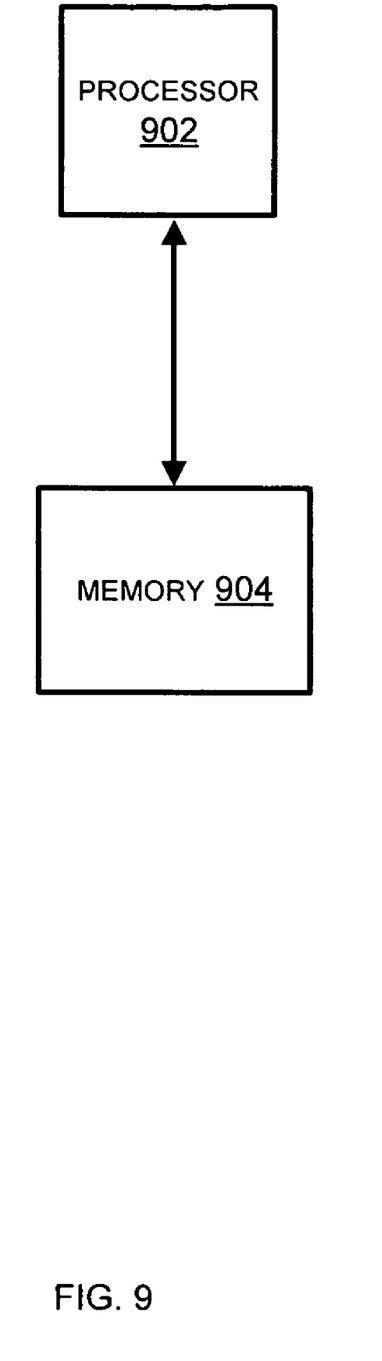
FIG. 9 is a block diagram of an embodiment of a device system including a combined volatile nonvolatile memory.

FIG. 9 is a block diagram of an embodiment of a device system including a combined volatile nonvolatile memory. The device will typically comprise at least one processor 902, for example a general purpose microprocessor, an embedded special-purpose processor, a digital signal processor, and so on. The processor 902 may interact with a memory 904 to read and write data during system operation. The memory 904 may comprise a combined volatile nonvolatile array of cells, in accordance with the structures and techniques described herein. In the course of operation, or upon imminent loss of system power, data may be stored from volatile regions of the memory 904 to the nonvolatile regions.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory circuit comprising:
   a single transistor storing both volatile and nonvolatile bit charges;
   wherein the volatile bit charge storage is accomplished via gate-to-bulk capacitances and source-to-drain capacitances of the single transistor.

2. The memory circuit of claim 1, wherein the single transistor storing both volatile and nonvolatile bit charges further comprises:
   a SONOS transistor.

3. The memory circuit of claim 1, wherein the single transistor storing both volatile and nonvolatile bit charges further comprises:
   a Floating-Gate transistor.

4. The memory circuit of claim 1, further comprising:
   first and second isolation transistors.

5. The memory circuit of claim 4, wherein the first and second isolation transistors further comprise:
   transistors having different gate-oxide thicknesses.

6. The memory circuit of claim 1, further comprising:
   a sensing circuit responsive to voltage differentials for volatile operations, and responsive to current flow for at least one nonvolatile operation.

7. The memory circuit of claim 1, further comprising:
   a bit cell comprising a pair of charge cells each storing both volatile and nonvolatile bit charges.

8. The memory circuit of claim 7, wherein a single transistor of each charge cell storing both volatile and nonvolatile bit charges further comprises:
   a SONOS transistor of each charge cell.

9. The memory circuit of claim 7, further comprising:
   a first charge cell of the pair storing both volatile and nonvolatile bit values, and a second charge cell of the pair storing complements of the volatile and nonvolatile bit values.

10. The memory circuit of claim 9, further comprising:
    the first charge cell coupled to a bit line and the second charge cell coupled to a complement bit line.

11. The memory circuit of claim 7, wherein each charge cell further comprises:
    first and second isolation transistors having different gate-oxide thicknesses.

12. A method of operating a combined volatile and nonvolatile memory circuit, comprising:
    causing a first charge representing a nonvolatile bit to be stored in a charge trapping region of a transistor, and causing a second charge representing a volatile bit to be stored via gate-to-bulk capacitances and source-to-drain capacitances of the transistor.

13. The method of claim 12, further comprising:
detecting the second charge as a voltage disturbance to bit line precharge levels that are approximately halfway between zero and one.

14. The method of claim 12, further comprising:
detecting the first charge via a current flow enabled when the first charge is present and absent otherwise.

15. The method of claim 12, further comprising:
refreshing the second charge from a bit line after a memory operation that affects the first charge.

16. The method of claim 15, further comprising:
refreshing the second charge from the bit line after a volatile memory READ operation that affects the first charge.

17. The method of claim 15, further comprising:
refreshing the second charge from the bit line after a nonvolatile memory ERASE operation that destroys the first charge.

18. The method of claim 15, further comprising:
refreshing the second charge from the bit line after a nonvolatile memory STORE operation that affects the first charge.

19. A device comprising:
a processor coupled to interact with a memory system, the memory system comprising:
an array of memory cells each storing a single volatile bit and a single nonvolatile bit, each cell employing a single transistor to store the volatile bit and to store the nonvolatile bit;
wherein the volatile bit charge storage is accomplished via gate-to-bulk capacitances and source-to-drain capacitances of the single transistor.

20. The device of claim 19, further comprising:
the single transistor a SONOS transistor.

21. The device of claim 19, further comprising:
each cell employing a single transistor to store a complement of the volatile bit and to store a complement of the nonvolatile bit.

* * * * *